(12) United States Patent
Wang et al.

(10) Patent No.: US 8,841,751 B2
(45) Date of Patent: Sep. 23, 2014

(54) THROUGH SILICON VIAS FOR SEMICONDUCTOR DEVICES AND MANUFACTURING METHOD THEREOF

(71) Applicant: Advanced Semiconductor Engineering, Inc., Kaohsiung (TW)

(72) Inventors: Chen-Chao Wang, Kaohsiung (TW); Ying-Te Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/748,068

(22) Filed: Jan. 23, 2013

(65) Prior Publication Data

US 2014/0203412 A1   Jul. 24, 2014

(51) Int. Cl.
| H01L 29/06 | (2006.01) |
| H01L 29/40 | (2006.01) |
| H01L 23/522 | (2006.01) |
| H01L 21/768 | (2006.01) |
| H01L 23/00 | (2006.01) |

(52) U.S. Cl.
CPC ...... *H01L 23/5226* (2013.01); *H01L 21/76898* (2013.01); *H01L 24/94* (2013.01)
USPC .......................................... 257/618; 257/621

(58) Field of Classification Search
CPC .......................... H01L 21/76898; H01L 24/94
USPC .................................................. 257/618, 621
See application file for complete search history.

(56) References Cited

U.S. PATENT DOCUMENTS

| 3,761,782 A | 9/1973 | Youmans |
| 4,394,712 A | 7/1983 | Anthony et al. |
| 4,499,655 A | 2/1985 | Anthony et al. |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian et al. |
| 5,191,405 A | 3/1993 | Tomita et al. |
| 5,229,647 A | 7/1993 | Gnadinger et al. |
| 5,239,448 A | 8/1993 | Perkins et al. |
| 5,308,443 A | 5/1994 | Sugihara et al. |
| 5,404,044 A | 4/1995 | Booth et al. |
| 5,615,477 A | 4/1997 | Sweitzer et al. |
| 5,643,831 A | 7/1997 | Ochiai et al. |
| 5,998,292 A | 12/1999 | Black et al. |
| 6,276,599 B1 | 8/2001 | Ogawa |

(Continued)

FOREIGN PATENT DOCUMENTS

| JP | 2002246540 A | 8/2002 |
| JP | 2004228135 A | 8/2004 |
| TW | 200612539 A | 8/2002 |

*Primary Examiner* — Ngan Ngo
(74) *Attorney, Agent, or Firm* — Stetina Brunda Garred & Brucker

(57) ABSTRACT

The present invention provides a semiconductor wafer, a semiconductor chip and a semiconductor package. The semiconductor wafer includes a first pad, a first inter-layer dielectric and a second pad. The first pad is disposed on a top surface of a semiconductor substrate and has a solid portion and a plurality of through holes. The first inter-layer dielectric covers the first pad. The second pad is disposed on the first inter-layer dielectric and has a solid portion and a plurality of through holes, wherein the through holes of the first pad correspond to the solid portion of the second pad.

20 Claims, 7 Drawing Sheets

(56) References Cited

U.S. PATENT DOCUMENTS

| | | |
|---|---|---|
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino et al. |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,017,514 B1 * | 3/2006 | Shepherd et al. ...... 118/723 ME |
| 7,078,269 B2 | 7/2006 | Yamasaki et al. |
| 7,134,198 B2 | 11/2006 | Nakatani et al. |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,351,597 B2 * | 4/2008 | Wada et al. ..................... 438/14 |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,532,021 B2 * | 5/2009 | Johnson ................... 324/757.03 |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara et al. |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 7,855,372 B2 * | 12/2010 | McGregor et al. ........ 250/390.01 |
| 8,674,470 B1 * | 3/2014 | Or-Bach et al. ................ 257/499 |
| 2001/0001989 A1 * | 5/2001 | Smith ........................... 174/52.1 |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |
| 2012/0077332 A1 * | 3/2012 | Abe et al. ....................... 438/460 |
| 2012/0132250 A1 * | 5/2012 | Cornfeld ....................... 136/244 |

* cited by examiner

THROUGH SILICON VIAS FOR SEMICONDUCTOR DEVICES AND MANUFACTURING METHOD THEREOF

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor technology, and more particularly to through silicon via (TSV) technology for semiconductor devices.

2. Description of the Related Art

Through silicon vias are formed in semiconductor devices to provide an electrical bridge between the active and inactive surfaces of the die. However, through silicon vias are also contemplated to connect to active circuitry from the back or inactive surface of the die.

When accessing the active circuitry from the inactive surface of the die, connection may be made to capture pads for the integrated circuit. During the etching process to form the through silicon via opening, the etchant fluid may pass through perforations in the capture pad thereby resulting in undesirable over-etching, and potential damage to the circuitry. That is, if the etching process to create the through silicon via cannot be carefully controlled, the etchant will contaminate the wafer and may cause damage to the integrated circuit. Also, the resultant conductive metal layer of the TSV may extend to another metal interconnect layer instead of terminating at the capture pad, thereby creating shorts within the die. Therefore, a unique interconnect structure and manufacturing process is needed.

BRIEF SUMMARY OF THE INVENTION

One embodiment of the present invention is directed to a semiconductor wafer, comprising a first pad, a first inter-layer dielectric and a second pad. The first pad is disposed on a top surface of a semiconductor substrate and has a solid portion and a plurality of through holes or perforations. The first inter-layer dielectric covers the first pad. The second pad is disposed on the first inter-layer dielectric and has a solid portion and a plurality of through holes or perforations. The perforations of the first pad correspond to (i.e., are each aligned with) the solid portion of the second pad.

Another embodiment of the present invention is directed to a semiconductor chip, comprising a first pad, a first inter-layer dielectric, a second pad and a conductive via. The first pad is disposed on a top surface of a semiconductor substrate and has a solid portion and a plurality of through holes or perforations. The first inter-layer dielectric covers the first pad. The second pad is disposed on the first inter-layer dielectric and has a solid portion and a plurality of through holes or perforations. The perforations of the first pad correspond to (i.e., are each aligned with) the solid portion of the second pad. The conductive via penetrates through the semiconductor substrate and contacts the first pad.

Another embodiment of the present invention is directed to a semiconductor package, comprising a die pad, a plurality of leads, a semiconductor chip or die, a plurality of bonding wires and a molding compound or package body. The leads at least partially surround and are insulated from the die pad. The semiconductor die is disposed on the die pad and comprises a first pad, a first inter-layer dielectric, a second pad and a conductive via. The first pad is disposed on a top surface of a semiconductor substrate and has a solid portion and a plurality of through holes or perforations. The first inter-layer dielectric covers the first pad. The second pad is disposed on the first inter-layer dielectric and has a solid portion and a plurality of through holes or perforations. The through holes of the first pad correspond to (i.e., are each aligned with) the solid portion of the second pad. The conductive via penetrates through the semiconductor substrate and contacts the first pad. The bonding wires electrically connect the semiconductor die to the leads. The package body encapsulates the semiconductor chip and the bonding wires.

BRIEF DESCRIPTION OF THE DRAWINGS

These, as well as other features of the present invention, will become more apparent upon reference to the drawings wherein.

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
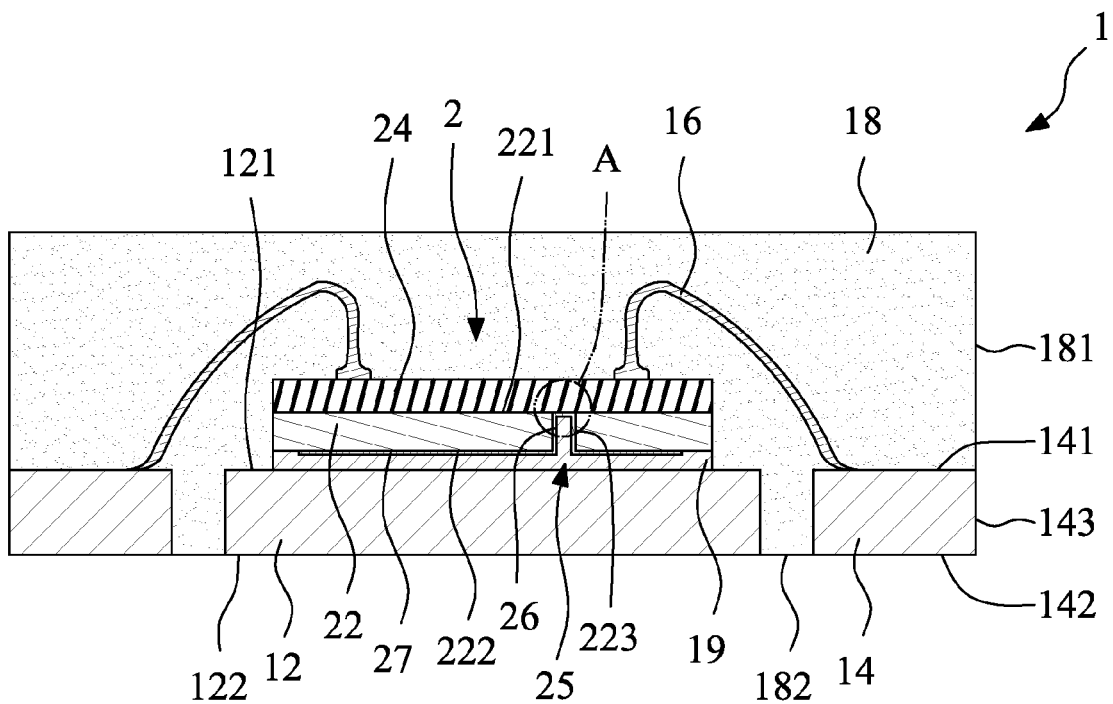
FIG. 1 is a cross-sectional side view of a semiconductor package according to an embodiment of the present invention.

Referring to FIG. 1, there is shown a cross-sectional side view of a semiconductor package 1 according to the present invention. The semiconductor package 1 comprises a die pad 12, a plurality of leads 14, a semiconductor chip or semiconductor die 2, a plurality of bonding wires 16, a molding compound or package body 18 and a conductive adhesive layer 19. The die pad 12 and the leads 14 may be collectively referred to as a lead frame or a circuit substrate.

When viewed from the perspective shown in FIG. 1, the die pad 12 has a top surface 121 and an opposed bottom surface 122. The bottom surface 122 is exposed in the package body 18. The leads 14 at least partially circumvent or surround the die pad 12 and are spaced apart from the die pad 12 and each other so that the leads 14 are insulated from the die pad 12 and each other. As also viewed from the perspective shown in FIG. 1, each of the leads 14 has a top surface 141, an opposed bottom surface 142 and a side surface 143, wherein the bottom surface 142 and the side surface 143 are exposed in the package body 18. In the embodiment of the semiconductor package 1 shown in FIG. 1, the material of the die pad 12 is Cu, which is the same as that of the leads 14, and the thickness of the die pad 12 is equal to that of each of the leads 14.

The semiconductor die 2 is disposed on the die pad 12, and comprises a semiconductor substrate 22, active circuitry 24, a conductive via 25 and a metal plane 27. In the semiconductor package 1, the material of the semiconductor substrate 22 is a semiconductor material such as silicon, germanium or other semiconductor materials such as group III, group IV, and/or group V elements. The semiconductor substrate 22 may be a bulk silicon substrate or a silicon-on-insulator (SOI) substrate.

As also viewed from the perspective shown in FIG. 1, the semiconductor substrate 22 has a top surface 221, an opposed bottom surface 222 and a through hole 223. The bottom surface 222 is attached to the top surface 121 of the die pad 12. The active circuitry 24 is disposed on the top surface 221 of the semiconductor substrate 22, and the metal plane 27 is disposed on the bottom surface 222 of the semiconductor substrate 22.

The conductive via 25 is disposed in the through hole 223 and electrically connects the active circuitry 24 to the metal plane 27, which may serve as a ground or power plane for the die 2. In the semiconductor package 1, the conductive via 25 comprises a conductive metal layer 26 which is disposed on the side wall of the through hole 223 of the semiconductor substrate 22, and defines a central bore. In the semiconductor package 1, the conductive metal layer 26 and the metal plane 27 are formed at the same time, with the material thereof being Cu. The metal plane 27 is typically made as large as possible, covering most of the bottom surface 222 of the semiconductor substrate 22. This serves to make circuit design easier, allowing the designer to electrically connect different conductive vias 25 to the metal plane 27 without having to run additional metal lines, thereby reducing electrical noise.

The conductive adhesive layer 19 is used for bonding the bottom surface 222 of the semiconductor substrate 22 (including the metal plane 27 of the semiconductor chip 2 formed thereon) to the top surface 121 of the die pad 12. In the semiconductor package 1, a portion of the conductive adhesive layer 19 may fill the central bore defined by the conductive metal layer 26. A ground path (or alternatively a power path) is formed from the active circuitry 24 to the die pad 12 (which may be connected to an external circuit board's ground point) through the conductive via 25, the metal plane 27 and the conductive adhesive layer 19. The conductive adhesive layer 19 may be a solder layer or other type of conductive material such as conductive film or paste.

The bonding wires 16 electrically connect the active circuitry 24 of the semiconductor die 2 to the top surfaces 141 of the leads 14. The package body 18 encapsulates the semiconductor die 2, the bonding wires 16, a portion of the die pad 12 and a portion of each of the leads 14. When also viewed from the perspective shown in FIG. 1, the package body 18 has a side surface 181 and a bottom surface 182. The side surface 181 of the package body 18 is generally coplanar with the side surface 143 of each of the leads 14, with the bottom surface 182 of the package body 18 being generally coplanar with the bottom surface 142 of each of the leads 14 and the bottom surface 122 of the die pad 12.

In another embodiment, the die pad 12 and the leads 14 may be replaced by another type of package substrate such as an organic substrate (e.g., fiberglass reinforced epoxy glass resin) or a ceramic substrate. In such alternative embodiment, the semiconductor die 2 is mounted on and electrically connected to such package substrate.

Figure 2:
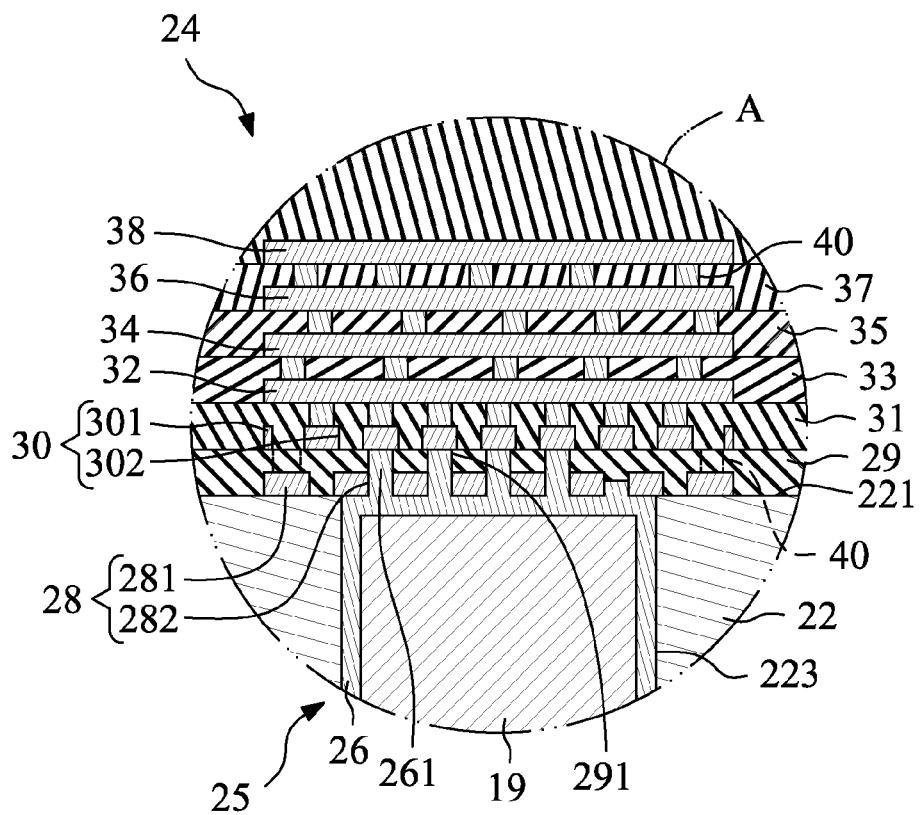
FIG. 2 is an enlargement of area A shown in FIG. 1.

Referring to FIG. 2, there is depicted an enlarged view of area A shown in FIG. 1. The active circuitry 24 of the semiconductor die 2 comprises a plurality of stacked inter-layer dielectrics 29, 31, 33, 35, 37, a plurality of metal interconnect layers, e.g., metal lines (not shown), a plurality of pads 28, 30, 32, 34, 36, 38 interposed between the inter-layer dielectrics 29, 31, 33, 35, 37, and a plurality of interconnection vias 40 electrically connecting the pads 28, 30, 32, 34, 36, 38 to each other.

Each of the inter-layer dielectrics 29, 31, 33, 35, 37 may comprise a low-k (dielectric constant is less than 3.4) or an ultra-low-k (dielectric constant is less than 2.5) dielectric layer. The material of the inter-layer dielectrics 29, 31, 33, 35, 37 may be the same as or different from each other. All but the lowermost one of the metal interconnect layers are disposed between respective pairs of the inter-layer dielectrics 29, 31, 33, 35, 37. The lowermost metal interconnect layer is disposed between the semiconductor substrate 22 and the inter-layer dielectric 29. The pads 28, 30, 32, 34, 36, 38 are defined by respective ones of the metal interconnect layers.

The material of the metal interconnect layers (and thus the pads 28, 30, 32, 34, 36, 38 defined thereby) and the interconnection vias 40 may be formed of copper or copper alloys. Specifically, the metal interconnect layers may each comprise a core conductor of copper (Cu) surrounded by a liner on the sidewalls and bottom of the core conductor, the liner comprising Ta, TaN, tantalum silicon nitride (TaSiN), tungsten (W), tungsten nitride (WN), titanium nitride (TiN) or combinations of layers thereof. Alternatively, the metal interconnect layers may also each include a layer of aluminum (Al) on the exposed top surface of the core conductor.

In the semiconductor package 1, the lowermost pad 28, hereinafter referred to as the first pad 28, is provided in the metal one (M1) of a back end of the line (BEOL) process. The first pad 28 is disposed on the top surface 221 of the semiconductor substrate 22 and has a mesh-like configuration defining perforations 282. That is, the first pad 28 is a mesh pad having a solid portion 281 and the perforations 282. In the semiconductor package 1, the lowermost inter-layer dielectric 29, hereinafter referred to as the first inter-layer dielectric 29, covers the first pad 28 and the top surface 221 of the semiconductor substrate 22.

During the etching process for forming the through hole 223 of the semiconductor substrate 22, the etchant may pass through the perforations 282 of the first pad 28 to etch the first inter-layer dielectric 29, thus forming a plurality of through holes or openings 291 in the first inter-layer dielectric 29. The openings 291 of the first inter-layer dielectric 29 thus correspond to (i.e., are aligned with) with respective ones of the perforations 282 of the first pad 28.

The pad 30 of the semiconductor package 1 disposed above the first pad 28, hereinafter referred to as the second pad 30, is provided in the metal two (M2) of a back end of the line (BEOL) process. The second pad 30 is disposed on the first inter-layer dielectric 29 and, like the first pad 28, has a mesh-like configuration defining a solid portion 301 and a plurality of perforations 302. Discrete sections of the solid portion 301 of the second pad 30 are exposed in respective ones of the openings 291 in the first inter-layer dielectric 29.

In the semiconductor package 1, the through hole 223 of the semiconductor substrate 22 exposes a portion of the first pad 28. Since, as indicated above, the openings 291 of the first inter-layer dielectric 29 are aligned with respective ones of the perforations 282 of the first pad 28 and discrete sections of the solid portion 301 of the second pad 30 are exposed in respective ones of the openings 291, it follows that the perforations 282 of the first pad 28 each correspond to (i.e., are aligned with) respective ones of the discrete sections defined by the solid portion 301 of the second pad 30. When the conductive metal layer 26 of the conductive via 25 is plated on the side wall of the through hole 223 of the semiconductor substrate 22, the conductive metal layer 26 contacts the first pad 28. The conductive via 25 extends from the first pad 28 downward to the bottom surface 222 (FIG. 1) of the semiconductor substrate 22.

In the semiconductor package 1, a portion of the conductive metal layer 26 of the conductive via 25 may extend into the perforations 282 of the first pad 28 and the openings 291 of the first inter-layer dielectric inter-level dielectric 29. However, the conductive metal layer 26 terminates at the solid portion 301 of the second pad 30 by virtue of its contact therewith. In addition, the inter-layer dielectrics 31, 33, 35, 37 and the pads 32, 34, 36, 38 are disposed on the second pad 30. Further, pads 32, 34, 36, 38 may be solid pads or mesh pads.

Figure 3:
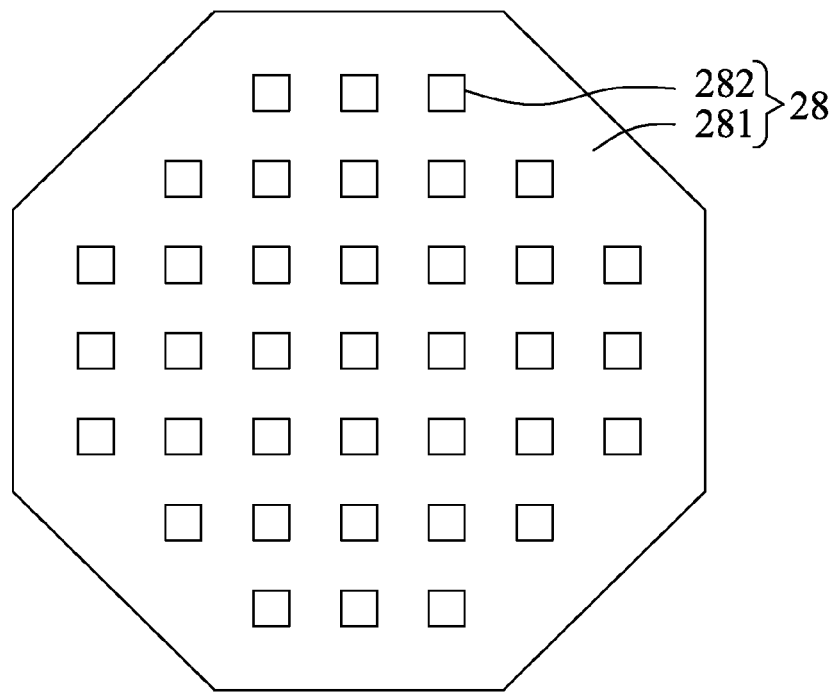
FIG. 3 is a top view of the first pad shown in FIG. 2.
Figure 4:
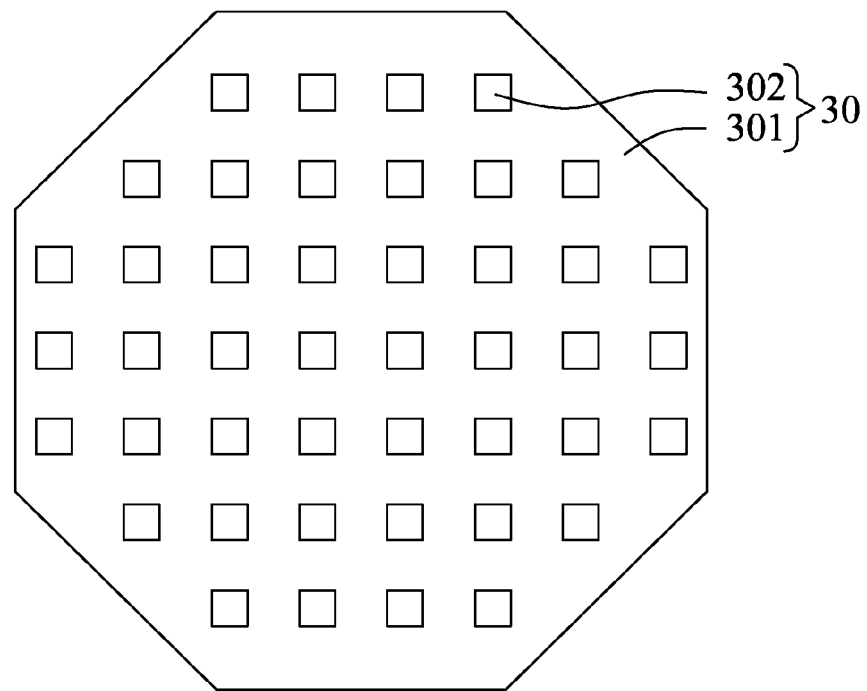
FIG. 4 is a top view of the second pad shown in FIG. 2.

Referring to FIGS. 3 and 4, there is depicted top views of the first pad 28 and the second pad 30, respectively, as shown in FIG. 2. Referring to FIG. 3, the perforations 282 of the first pad 28 are spaced apart from each other by equal distances, and are arranged in a first pattern. Referring to FIG. 4, the perforations 302 of the second pad 30 are similarly spaced apart from each other by equal distances, and are arranged in a second pattern.

As further shown in FIGS. 3 and 4, the appearances of the first pattern and the second pattern are the generally same, though the first pattern is opposite or offset relative to the second pattern. That is, the locations of the perforations 282 of the first pattern are different from those of the perforations 302 of the second pattern. More particularly, the second pattern is determined by shifting the first pattern with a suitable distance in a certain direction (from left to right), so that the axes of the perforations 282 of the first pad 28 are misaligned with those of the perforations 302 of the second pad 30. As a result, the perforations 282 of the first pad 28 can face or be aligned with corresponding discrete sections of the solid portion 301 of the second pad 30 as indicated above, the perforations 282 of the first pad 28 thus not being aligned with the perforations 302 of the second pad 30.

Alternatively, the second pad 30 may be replaced by a pad comprising a solid portion but no through holes or perforations therein. In this way, the conductive metal layer 26 of the conductive via 25 will contact and thus terminate at the solid portion when a portion of the conductive metal layer 26 of the conductive via 25 extends into the perforations 282 of the first pad 28 and the openings 291 of the first inter-layer dielectric 29.

Figure 5:
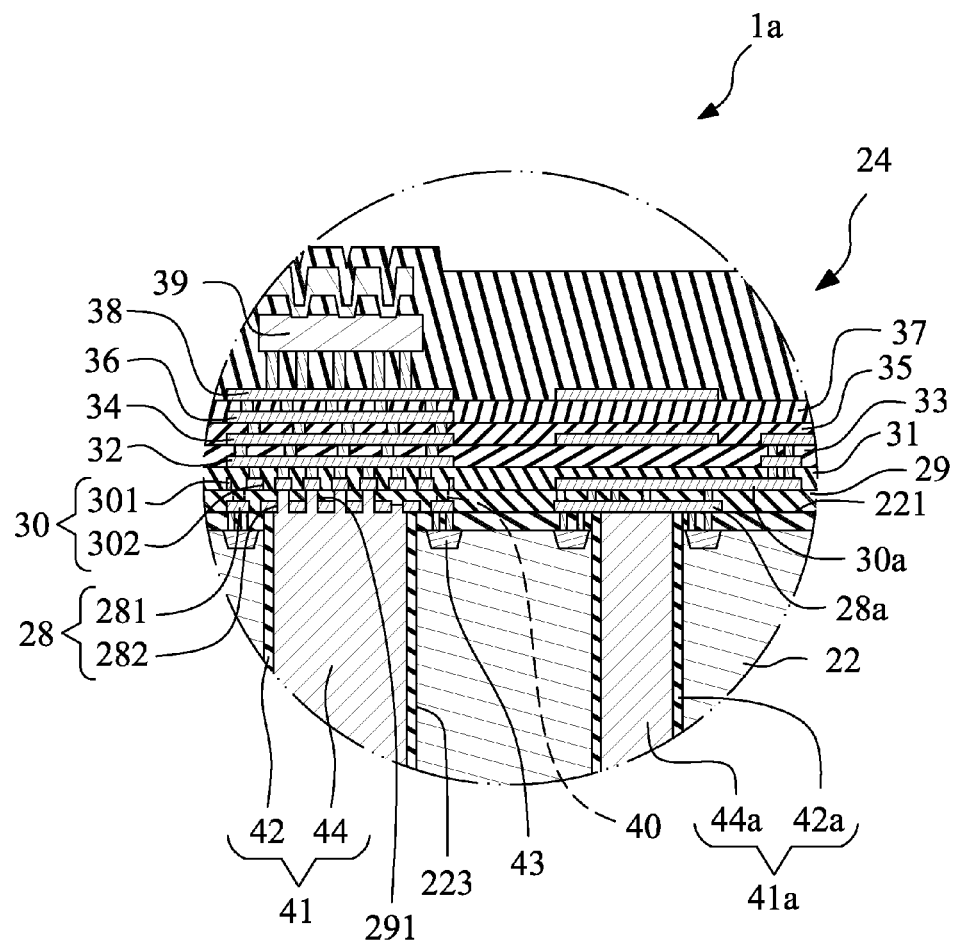
FIG. 5 is a cross-sectional side view of the conductive via according to another embodiment of the present invention.

Referring to FIG. 5, there is depicted a partial cross-sectional side view of a semiconductor package 1a constructed in accordance with another embodiment of the present invention and including a conductive via 41. The conductive via 41 of this alternative embodiment is substantially similar to the conductive via 25 shown in FIG. 2, with only the differences between the semiconductor packages 1, 1a, and in particular the conductive vias 25, 41 thereof, being described in more detail below.

More particularly, the conductive via 25 of the semiconductor package 1 shown in FIG. 2 is a ground TSV, whereas the conductive via 41 of the semiconductor package 1a shown in FIG. 5 is a power TSV. The conductive via 41 comprises a conductive metal 44 and an insulating material layer 42. The insulating material layer 42 is disposed on the side wall of the through hole 223 of the semiconductor substrate 22 so as to define a central bore. The conductive metal 44 fills the central bore forming a solid pillar.

In the semiconductor package 1a, the insulating material layer 42 is a polymer layer, such as polyimide (PI) or polypropylene (PP), and the conductive metal 44 is Cu. The conductive metal 44 of the conductive via 41 is plated in the central bore defined by the insulating material layer 42 to contact the first pad 28. A portion of the conductive metal 44 of the conductive via 41 may extend through the perforations 282 of the first pad 28 and the openings 291 of the first inter-layer dielectric 29 to contact and thus terminate at the solid portion 301 of the second pad 30. However, the conductive metal 44 may not extend beyond the perforations 282 of the first pad 28. The first pad 28 may be electrically connected to trench isolation regions 43 (such as source or drain) in the semiconductor substrate 22 of the semiconductor package 1a. In addition, the pad 38 of the semiconductor package 1a may be electrically connected to a pad 39 that is further electrically connected to a bonding pad (not shown).

In the semiconductor package 1a, the semiconductor die 2 further comprises a signal TSV 41a, and the active circuitry 24 further comprises a first pad 28a and a second pad 30a. The first pad 28a is provided in the metal one (M1) of a back end of the line (BEOL) process, and the second pad 30a is provided in the metal two (M2).

The signal TSV 41a comprises a conductive metal 44a and an insulating material layer 42a. The insulating material layer 42a is disposed on the side wall of the through hole 223 of the semiconductor substrate 22 so as to define a central bore. The conductive metal 44a fills the central bore. The conductive metal 44a of the conductive via 41a contacts the first pad 28a. The first pad 28a and the second pad 30a may be mesh pads, which are the same as the first pad 28 and the second pad 30, respectively, of the semiconductor package 1a. However, the first pad 28a and the second pad 30a may be solid pads.

Referring to FIGS. 6-12, there is depicted an exemplary sequence of steps for fabricating the semiconductor die 2 integrated into the semiconductor package 1 described above.

Figure 6:
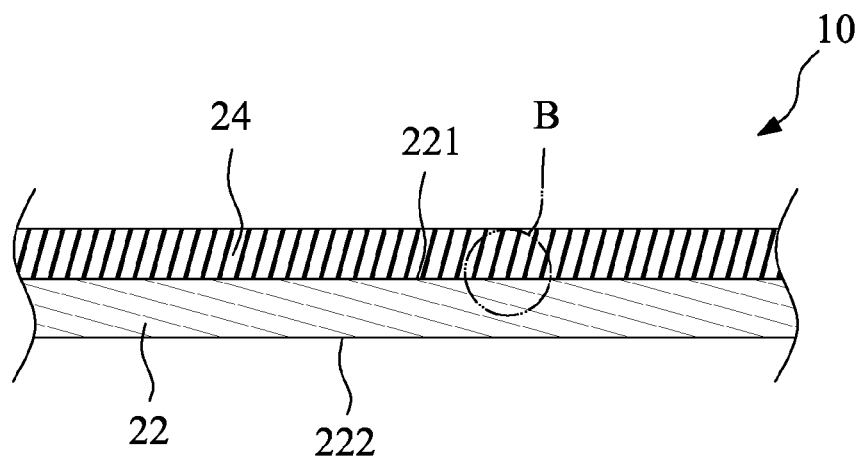
FIGS. 6-12 illustrate an exemplary sequence of steps for fabricating a semiconductor chip according to an embodiment of the present invention.
Figure 7:
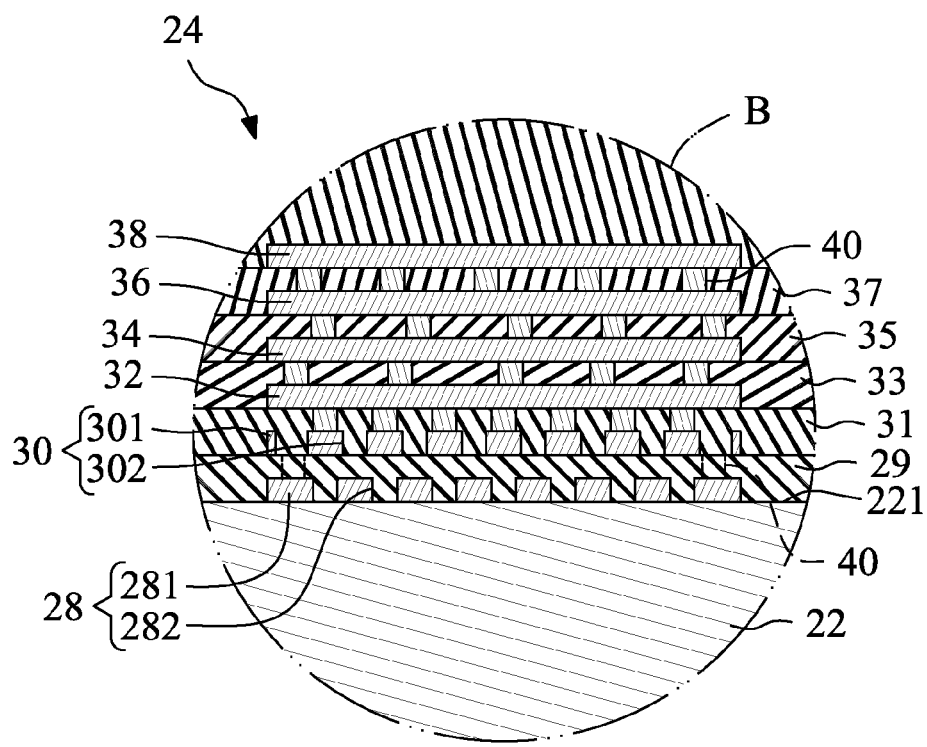

Referring to FIGS. 6 and 7, wherein FIG. 7 is an enlarged view of area B shown in FIG. 6, a semiconductor wafer 10 is provided in the initial step of the fabrication process. The semiconductor wafer 10 comprises the semiconductor substrate 22 and the active circuitry 24 described above. The material of the semiconductor substrate 22 is a semiconductor material such as silicon or germanium.

As previously explained, the semiconductor substrate 22 has a top surface 221 and a bottom surface 222. The active circuitry 24 is disposed on the top surface 221 of the semiconductor substrate 22. The active circuitry 24 comprises the plurality of inter-layer dielectrics 29, 31, 33, 35, 37, the plurality of pads 28, 30, 32, 34, 36, 38, and the plurality of interconnection vias 40 connecting the pads 28, 30, 32, 34, 36, 38, as described above. As also previously explained, the lowermost first pad 28, which is provided in the metal one (M1) of a back end of the line (BEOL) process, is disposed on the top surface 221 of the semiconductor substrate 22, and includes the solid portion 281 having the plurality of perforations 282 arranged in the aforementioned first pattern therein. The lowermost first inter-layer dielectric 29 covers the first pad 28 and the top surface 221 of the semiconductor substrate 22.

The above-described second pad 30 which is disposed above the first pad 28 is provided in the metal two (M2) of a back end of the line (BEOL) process. The second pad 30 is disposed on the first inter-layer dielectric 29 and has the solid portion 301 and the plurality of perforations 302 arranged in the aforementioned second pattern therein. As previously explained, the perforations 282 of the first pad 28 correspond to or are aligned with respective discrete sections of the solid portion 301 of the second pad 30, with the axes of the perforations 282 of the first pad 28 thus being misaligned of offset relative to the perforations 302 of the second pad 30.

Figure 8:
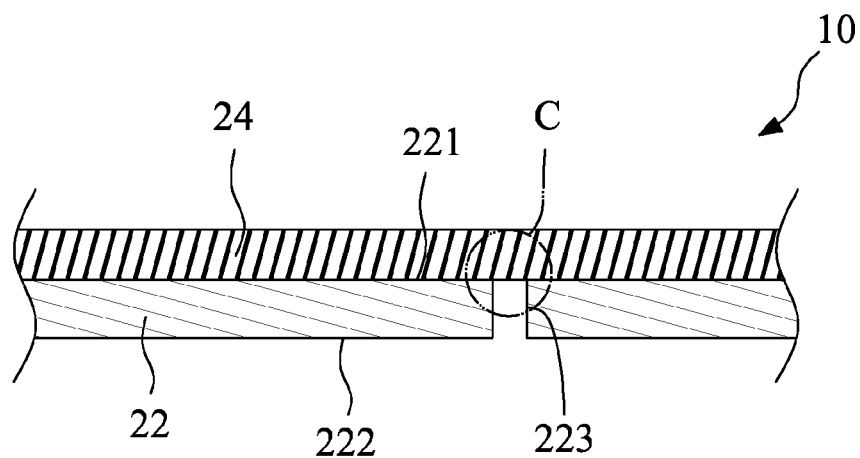
Figure 9:
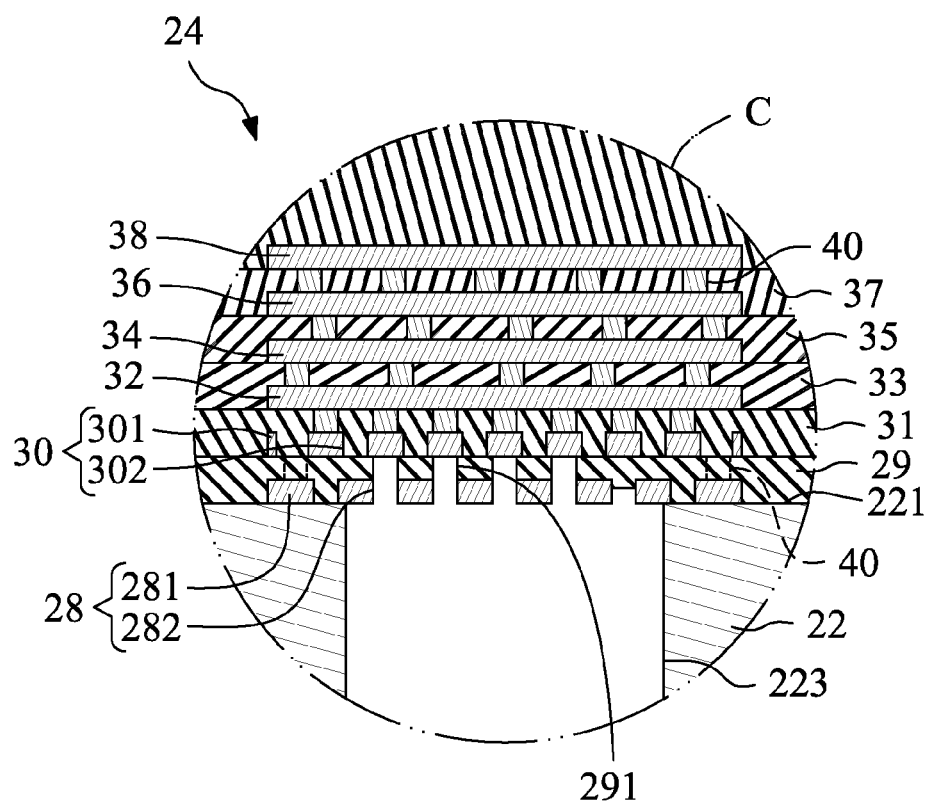

Referring to FIGS. 8 and 9, wherein FIG. 9 is an enlarged view of area C shown in FIG. 8, in the next step of the fabrication process, the semiconductor wafer 10 is etched from the bottom surface 222 of the semiconductor substrate 22 so as to form the through hole 223 and thus expose the first pad 28 of the active circuitry 24. Specifically, the through hole 223 may be formed by applying a photoresist layer on the bottom surface 222, exposing the photoresist to actinic radiation and developing the exposed (positive resist) or unexposed (negative resist) and then reactive ion etching (RIE) the substrate. Combinations of RIE and wet etches may be used. Examples of suitable wet etchants include, but are not limited to aqueous tetrametylammonium hydroxide (TMAH), alcoholic potassium hydroxide (KOH) and other aqueous/alcoholic base solutions.

During the etching process, the etchant may pass through the perforations 282 of the first pad 28 to etch the first inter-layer dielectric 29 and form the plurality of openings 291 to expose respective discrete sections of the solid portion 301 of the second pad 30 as indicated above. As also previously explained, because the perforations 282 of the first pad 28 also correspond to or are aligned with respective discrete sections of the solid portion 301 of the second pad 30, the etchant will be effectively blocked by the solid portion 301 of the second pad 30 (since the type of etchant is selected to be unable or very difficult to etch the material of the pad 30). Therefore, the etchant will terminate at the second pad 30 which prevents contamination of the wafer 10. If the etchant is not controlled accurately, it will not enter the perforations 282 of the first pad 28, and no openings 291 will be formed in the first inter-layer dielectric 29.

Figure 10:
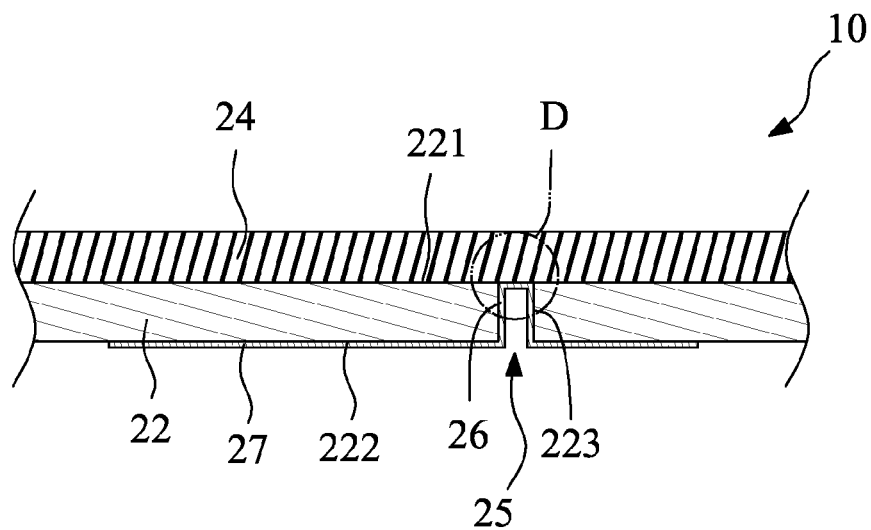
Figure 11:
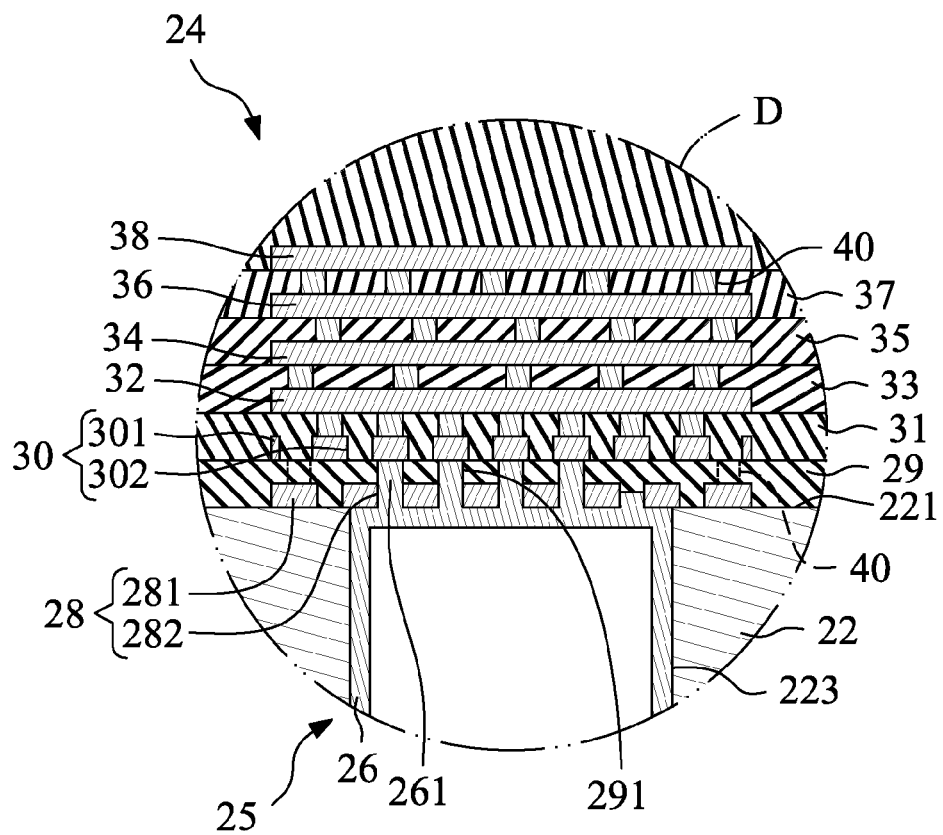

Referring to FIGS. 10 and 11, wherein FIG. 11 is an enlarged view of area D in FIG. 10, in the next step of the fabrication process, a conductive metal is plated in the through hole 223 and on the bottom surface 222 of the semiconductor substrate 22. The conductive metal that is disposed on the side wall of the through hole 223 defines the conductive metal layer 26 which itself defines the aforementioned central bore. The conductive metal that is disposed on the bottom surface 222 of the semiconductor substrate 22 defines the aforementioned metal plane 27. The conductive metal 26 layer is the conductive via 25, and contacts the first pad 28. A portion of the conductive metal layer 26 of the conductive via 25 may extend beyond the perforations 282 of the first pad 28 and into the openings 291 of the first inter-layer dielectric 29 to contact the solid portion 301 of the second pad 30, the conductive metal layer 26 thus terminating at the second pad 30. If no openings 291 are formed, the conductive metal layer 26 will not extend beyond the perforations 282 of the first pad 28, and will terminate at the first pad 28.

Figure 12:
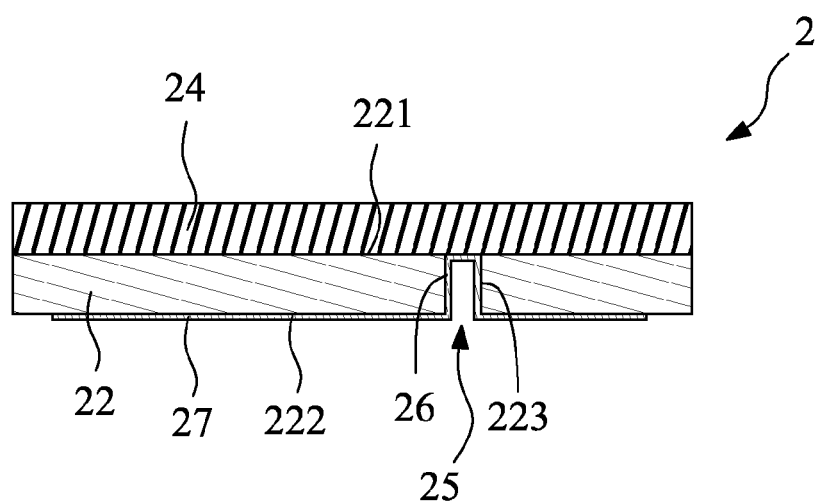

Referring to FIG. 12, in the last step of the fabrication process, the semiconductor wafer 10 is diced to form a plurality of semiconductor chips 2. Then, after the die attaching process, the wire bonding process, the molding process and the singulation process, the semiconductor package 1 of FIG. 1 is formed.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor wafer, comprising:
   a semiconductor substrate defining opposed top and bottom surfaces;
   active circuitry disposed on the top surface of the substrate, the active circuitry including a plurality of stacked inter-layer dielectrics and plurality of metal interconnect layers which are integrated into the inter-layer dielectrics in spaced relation to each other;
   a first pad having a solid portion and a plurality of perforations, the first pad being provided in a first one of the metal interconnect layers; and
   a second pad defining a solid portion, the second pad being provided in second one of the metal interconnect layers and positioned relative to the first pad such that the perforations of the first pad are aligned with respective discrete sections defined by the solid portion of the second pad.

2. The semiconductor wafer of claim 1, wherein the second pad has a plurality of perforations formed therein, the perforations of the first and second pads each defining an axis, with the second pad being positioned relative to the first pad such that the axes of the perforations of the second pad are offset to a prescribed orientation relative to the axes of the perforations of the first pad.

3. The semiconductor wafer of claim 1, further comprising at least one interconnection via for electrically connecting the solid portion of the first pad to the solid portion of the second pad.

4. The semiconductor wafer of claim 1, further comprising a conductive via which extends through the semiconductor substrate into electrically conductive contact with at least the solid portion of the first pad.

5. The semiconductor wafer of claim 4, wherein the conductive via further extends through at least one of the inter-layer dielectrics into electrically conductive contact with the solid portion of the second pad.

6. The semiconductor wafer of claim 4, wherein the conductive via comprises:
   a through hole disposed in the substrate and defining a side wall;
   a conductive metal layer formed on the side wall and extending into electrically conductive contact with the solid portions of the first and second pads, the conductive metal layer defining a central bore; and
   a conductive adhesive filled into the bore of the conductive metal layer.

7. The semiconductor wafer of claim 4, wherein the conductive via comprises:
   a through hole disposed in the semiconductor substrate and defining a side wall;
   an insulative layer formed on the side wall and defining a central bore; and
   a conductive metal filled into the bore of the insulative layer and extending into electrically conductive contact with the solid portions of the first and second pads.

8. A semiconductor package, comprising:
a circuit substrate;
a semiconductor die mounted on and electrically connected to the circuit substrate, the semiconductor die comprising:
   a semiconductor substrate defining opposed top and bottom surfaces;
   active circuitry disposed on the top surface of the substrate, the active circuitry including a plurality of stacked inter-layer dielectrics and plurality of metal interconnect layers which are integrated into the inter-layer dielectrics in spaced relation to each other;
   a first pad having a solid portion and a plurality of perforations, the first pad being provided in a first one of the metal interconnect layers; and
   a second pad defining a solid portion, the second pad being provided in second one of the metal interconnect layers and positioned relative to the first pad such that the perforations of the first pad are aligned with respective discrete sections defined by the solid portion of the second pad; and
   a conductive via extending from the solid portion of the first pad to the bottom surface of the semiconductor substrate.

9. The semiconductor package of claim 8, wherein the second pad has a plurality of perforations formed therein, the perforations of the first and second pads each defining an axis, with the second pad being positioned relative to the first pad such that the axes of the perforations of the second pad are offset to a prescribed orientation relative to the axes of the perforations of the first pad.

10. The semiconductor package of claim 8, wherein the conductive via further extends through at least some of the perforations of the first pad and at least one of the inter-layer dielectrics into electrically conductive contact with the solid portion of the second pad.

11. The semiconductor package of claim 10, wherein the conductive via comprises:
   a through hole disposed in the substrate and defining a side wall;
   a conductive metal layer formed on the side wall and extending into electrically conductive contact with the solid portions of the first and second pads, the conductive metal layer defining a central bore; and
   a conductive adhesive filled into the bore of the conductive metal layer.

12. The semiconductor package of claim 10, wherein the conductive via comprises:
   a through hole disposed in the semiconductor substrate and defining a side wall;
   an insulative layer formed on the side wall and defining a central bore; and
   a conductive metal filled into the bore of the insulative layer and extending into electrically conductive contact with the solid portions of the first and second pads.

13. The semiconductor package of claim 8, further comprising a metal plane disposed on a bottom surface of the semiconductor substrate, the conductive via being electrically connected to the metal plane.

14. A semiconductor wafer, comprising:
a substrate defining opposed top and bottom surfaces;
active circuitry which is disposed on the top surface of the substrate and comprises a plurality of stacked inter-layer dielectrics having a plurality of metal interconnect layers integrated therein in spaced relation to each other;
a first pad which has a solid portion and a plurality of perforations, and is provided in a first one of the metal interconnect layers; and
a second pad which has a solid portion, and is provided in a second one of the metal interconnect layers in a position relative to the first pad such that the perforations of the first pad are aligned with respective discrete sections defined by the solid portion of the second pad;
the bottom surface of the substrate being etched to form a through hole therein which exposes the first pad of the active circuitry, with a conductive via being formed in the through hole to extend into electrically conductive contact with the first pad.

15. The semiconductor wafer of claim 14 wherein the conductive via comprises a conductive metal layer which is plated in the through hole, defines a central bore, and extends into electrically conductive contact with the first pad.

16. The semiconductor wafer of claim 15 wherein at least one of the inter-layer dielectrics is etched in a manner wherein the conductive metal layer further extends through at least some of the perforations of the first pad and the etched one of the inter-layer dielectrics into electrically conductive contact with the solid portion of the second pad.

17. The semiconductor wafer of claim 15 wherein the central bore of the conductive metal layer is filled with a conductive adhesive.

18. The semiconductor wafer of claim 15 wherein the conductive metal layer is further plated onto a portion of the bottom surface of the substrate to form a metal plane thereon.

19. The semiconductor wafer of claim 14 wherein the conductive via comprises an insulting material layer which is disposed in the through hole and defines a central bore, and a conductive metal which is filled into the central bore and extends into electrically conductive contact with the first pad.

20. The semiconductor wafer of claim 19 wherein at least one of the inter-layer dielectrics is etched in a manner wherein the conductive metal further extends through at least some of the perforations of the first pad and the etched one of the inter-layer dielectrics into electrically conductive contact with the solid portion of the second pad.

* * * * *